INTEGRATED MICROWAVE SIGNAL AMPLIFIER CIRCUIT

Filed Aug. 10, 1965 2 Sheets-Sheet 1

Inventor
RICHARD CALVIN HAVENS
BY
Mueller, Aichele & Rauner
ATTYS.

Inventor
RICHARD CALVIN HAVENS
BY
Mueller, Aichele & Rauner
ATTYS.

3,402,361
Patented Sept. 17, 1968

3,402,361

INTEGRATED MICROWAVE SIGNAL AMPLIFIER CIRCUIT

Richard Calvin Havens, Phoenix, Ariz., assignor to Motorola, Inc., Franklin Park, Ill., a corporation of Illinois Filed Aug. 10, 1965, Ser. No. 478,656
7 Claims. (Cl. 330—61)

ABSTRACT OF THE DISCLOSURE

A negative resistive type amplifier utilizing the negative characteristics of a tunnel diode connected in the integrated microwave structure for producing low noise, high gain and a wide band width.

This invention pertains to an integrated microwave signal amplifier and more particularly to such an amplifier including a tunnel diode and an integrated strip transmission line.

Many types of microwave receivers are required having low noise figures and high sensitivity. Among the components necessary for such a microwave receiving system, is a tuned radio frequency amplifier which is compact and lightweight, has a low noise figure and is stable under varied environmental conditions. In the past various microwave amplifiers such as parametric amplifiers, were used in such RF receivers, but these were of considerable size and weight. These amplifiers could provide satisfactory gain but were very large and complex, and the bandwidth was objectionally narrow.

An object of this invention is to provide an improved integrated radio frequency signal amplifier which is relatively small and compact.

Another object of this invention is to provide an integrated tunnel diode amplifier that operates at microwave frequencies, where a wave length becomes physically quite small, yet is still relatively easy to assemble and construct.

A further object of this invention is to provide an integrated tunnel diode microwave amplifier that has a low noise figure and which exhibits relatively high gain and a wide bandwidth.

Still another object of this invention is to provide an integrated tunnel diode radio frequency amplifier that is stable under various environmental conditions.

A feature of this invention is a radio frequency microwave signal amplifier including a circulator and an amplifier module which includes an integrated strip transmission line coupling the signal from the circulator to a negative alternating current resistance in the amplifier module, which negative resistance reflects the signal at a greater level than the level of the incident signal, thereby increasing the gain of the signal.

Another feature of this invention is a radio frequency microwave signal amplifier having the integrated strip transmission line including a broad banding network to match the impedance between the negative resistance amplifier and the circulator thereby increasing the bandwidth of the amplifier.

Still another feature of this invention is a microwave signal integrated tunnel diode amplifier having a biasing network for the tunnel diode comprising a conducting member in electrical contact with an electrode of the diode and having a dielectric separating the same from one of the ground plane conductors of the strip transmission line to form a capacitor therewith and a low impedance transmission line. A lock nut electrically and mechanically coupled to a reference potential through one of the ground plane conductors secures a bias resistor to the conducting member. The bias network biases the tunnel diode in the operating region of its current-voltage characteristic so that it behaves as a negative alternating current resistance.

A further feature of this invention is an integrated microwave signal circuit having a strip transmission line and a variable tuner including a waveguide operated below in its cutoff frequency. One end of the strip transmission line is connected to the bottom of the waveguide to form a fixed short therewith, and a movable plunger is slidably mounted in the waveguide and varies the reactance of the waveguide about a center frequency established by the fixed short. The variable tuner can be coupled in shunt to the tunnel diode for parallel resonating the same so that the diode impedance is nearly a pure negative alternating current resistance.

In accordance with the invention the amplifier module includes an integrated strip transmission line which has one portion thereof coupled to a tunnel diode. A circulator, which functions to separate the input signal from the output signal and to provide a constant load for the tunnel diode over a broad frequency range, is connected to the other end of the transmission line. The tunnel diode is biased in the operating region of its current voltage characteristic where it behaves as a negative alternating current resistance. A signal to be amplified enters the circulator and is amplified thereby to the amplifier module. At this point the signal is coupled by the first portion of the strip transmission line to the tunnel diode where it is reflected back along the transmission line into the circulator and out the output port. Because the tunnel diode behaves as a negative alternating current resistance, the signal is reflected at a greater level than the level of the incident signal so the signal gain increases. A tuning circuit which includes a second portion of the transmission line couples the diode to a waveguide operated *below* its waveguide cutoff frequency. This waveguide is of variable length, is located within the amplifier module and parallel resonates the tunnel diode at the operating frequencies so that the tunnel diode impedance is essentially a pure negative resistance.

A broad banding network can be included in the first portion of strip transmission line to match the impedance between the parallel tuned tunnel diode and the circulator. By use of double or even triple or greater tuning considerably wider bandwidths are obtained for the amplifier.

Figure 1:
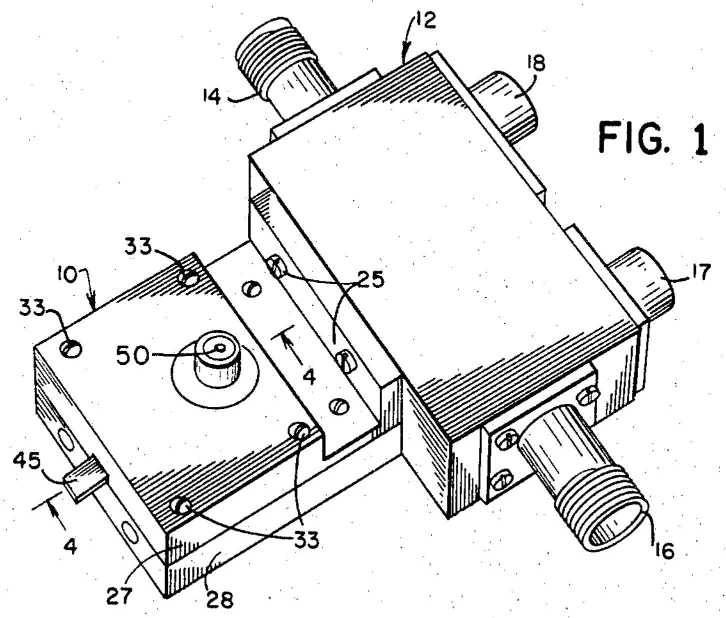
FIG. 1 is a perspective view of the circulator and amplifier module of this invention.
Figures 2, 3:
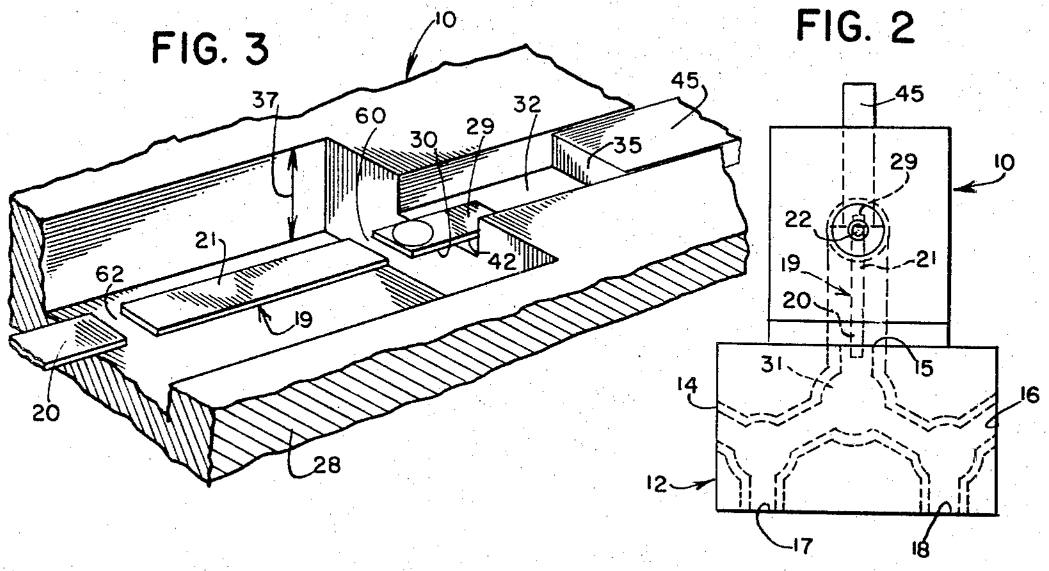
FIG. 2 is a top view of the device of FIG. 1.
FIG. 3 is a perspective view of a portion of the amplifier module of the device of FIG. 1 showing the mounting of the strip transmission line.

One particular embodiment of this invention is shown in FIGS. 1 and 2. A single port amplifier module 10 has a circulator 12 connected thereto. The circulator acts both to separate the input and output signals and to provide a constant impedance load for the tunnel diode over a broad frequency range. The circulator 12 has an input port 14, a port 15 (FIG. 2) coupled to the amplifier module 10, an output port 16, and two load ports 17 and 18.

Figures 4, 5:
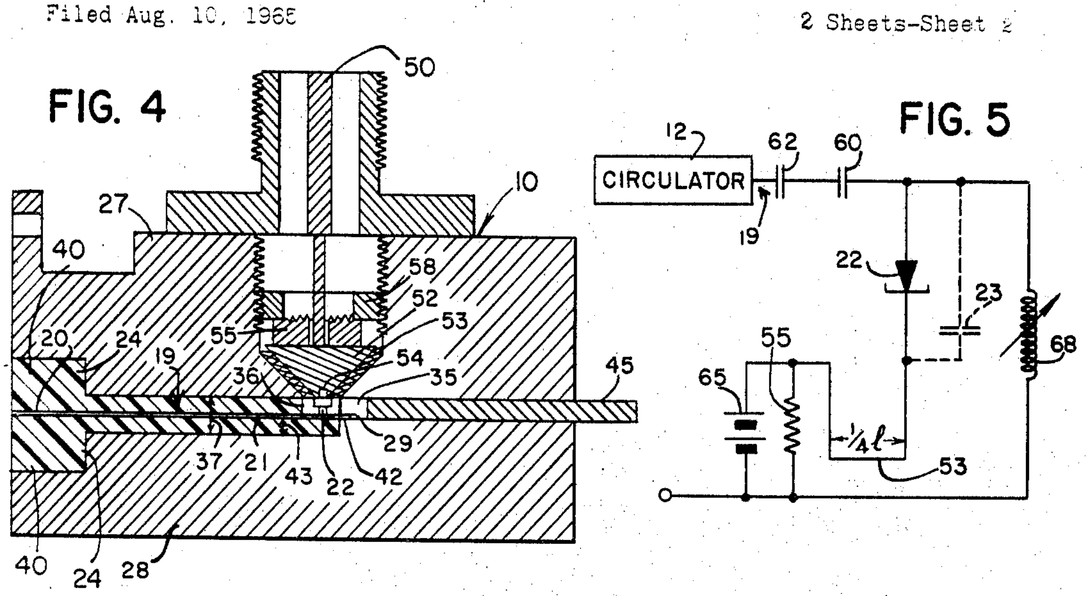
FIG. 4 is a cross-section of the amplifier module of FIG. 1 taken along the line 4—4.
FIG. 5 is an equivalent schematic circuit diagram of the amplifier module.

An integrated strip transmission line 19 best shown in FIGS. 3 and 4 couples the received signal from the port 15 to the tunnel diode 22. The center conductor strips 20, 21 and 29 are photoetched from .002 inch thick copper shim stock to provide the exact amplifier module characteristic impedance required, and are dielectric loaded on the top and bottom thereof by the sections 24 made from a dielectric material such as rexolite. The strips 20, 21 and 29 and surrounding dielectric sections 24 are sandwiched between the ground plane conductors 27 and 28 as shown in FIG. 4.

The transmission line 19 shown in FIG. 4 has one continuous strip center conductor and a first portion 20 and 21 that extends from the circulator center conductor 31 and terminates at the diode 22. A second portion 29 extends from the diode 22 into the waveguide 35 which is used to tune the amplifier as will be explained subsequently. The transmission line 19 shown in FIG. 3 has the same portions 20, 21 and 29, but the first portion 20 and 21 rather than being a continuous center conductor includes capacitive gaps 60 and 62 for a broadbanding network which will also be discussed subsequently.

The amplifier module 10 is easily assembled by bolting the lower half or ground plane conductor 28 to the circulator 12 (FIG. 1). Next the photoetched strips 20, 21 and 29 are laid into position as shown in FIG. 3 on top of the dielectric 24 as shown in FIG. 4, and the bottom 30 of portion 29 of the center conductor is soldered to the bottom 32 of the waveguide 35. The bottom of the strip 20 is soldered to the top of center conductor 31 of circulator 12 (FIG. 2). The upper half or ground plane conductor 27 complete with dielectric 24 is then bolted in position by bolts 25 to the circulator and by bolts 33 to the lower ground plane 28. This assembly method eliminates connectors between circulator 12 and amplifier module 10, thereby improving reliability of the circuit and reducing the size and complexity of the amplifier device.

The dielectric loaded strip transmission line 19 is designed to have an overall height 37 twice that of the miniature diode package 22 (FIG. 4) so that no additional reactance is introduced by an additional mounting structure (metal post) which would be required to extend the electrode 52 to contact the diode 22, if the line were made a greater height. This measure helps to insure wide instantaneous amplifier bandwidth. In addition the strip transmission line 19 of the amplifier module 10 is widened at the circulator port 15, as shown by the portions 40, but it still maintains the same characteristic impedance. Portions 40 act as a transition between the circulator 12 and the amplifier module 10, thereby insuring a low voltage standing wave ratio connection between the two components, resulting in stability and smooth gain response in the amplifier device.

A tuner needed to parallel resonate the tunnel diode is shown in FIG. 4. The second portion 29 of the transmission line center conductor connects the waveguide 35 in shunt with the tunnel diode 22. The tuner is partially provided by a fixed short 42 where the bottom 30 of the second portion 29 of the transmission line center strip is soldered to the bottom 32 of the waveguide 35. A movable tuner or plunger 45 is placed in the waveguide 35 and provides a vernier adjustment about the center frequency determined by the fixed short position 42 in the lower half of the strip transmission line indicated at 43. The rectangular opening for the movable short is designed as a waveguide 35, with the ground plane conductors 27 and 28 forming the walls of the waveguide. The waveguide 35 is designed to operate far below its cutoff frequency, which could be for example 35 gc. for a 9 gc. amplifier, so that it presents a tuning reactance relatively independent of frequency but dependent upon cavity length. For this reason, the frequency adjustment is less sensitive to tuning length than a conventional transmission line short tuner, thereby making the amplifier tuning adjustment easier to set. The tuning arrangement also provides for simple assembly of the amplifier module 10 as previously explained. By making the tuning cavity or waveguide 35 narrow, it functions as a suppressor, to suppress waveguide modes in the waveguide 35 which could cause spurious oscillations at frequencies up to the tunnel diode 22 cutoff frequency. Since the cavity 35 is a waveguide operating below cutoff, the longer the cavity 35 is made, the weaker are the electromagnetic fields at the movable short 45 position. Thus, the contact resistance of the plunger 45 with the waveguide walls 35 are not so critical as in conventional transmission lines with the result that the optimum tunnel diode amplifier noise figure is easy to obtain.

A bias circuit is necessary to hold the tunnel diode 22 in the operating region of its current-voltage characteristic where negative alternating current resistance occurs and to prevent spurious oscillations. The structure of the bias network within the amplifier module 10 is shown in FIG. 4

A DC bias terminal 50 extends into the module 10 and makes electrical contact with a cone shaped electrode 52. The electrode 52 is in electrical contact with electrode 54 of the diode 22 package and is separated from the ground plane conductor 27 by a very thin layer of dielectric, such as Mylar or Teflon. The member 52 and the conductor 27 form a short length of extremely low impedance, high capacity transmission line 53. This transmission line extends from the diode 22 to a washer-shaped metallic film bias resistor 55 which has contact terminals located on opposite sides thereof. Resistor contact is made to the low impedance bias circuit transmission line 53 through contact with the flat surface of the conical shaped bias circuit electrode 52. A lock nut 58 not only functions to hold the bias resistor 55 firmly in place on electrode 52, but it also provides a ground contact to the other side of the resistor 55 through the ground plane conductor 27. The bias voltage, therefore, is applied between the cone shaped bias circuit plate 52 and ground.

The resistance of the bias resistor 55 should be relatively high compared to the low impedance of the transmission line 53. The low impedance high capacity transmission line 53 has a length of approximately one-quarter wavelength so that the input impedance to the bias circuit at the diode 22 is extremely low. This effectively isolates the bias circuit from the RF circuit at the operating frequencies. In addition, the value of bias resistor 55 should be relatively low compared to the absolute value of the tunnel diode negative resistance to prevent diode switching. Change in temperature can affect the gain of the amplifier, and to minimize such effects the metallic film bias resistor 55 has a low DC temperature coefficient of resistance, so that it will be stable for varied environmental conditions.

A parallel resonant X-band tunnel diode amplifier as described has a typical three db bandwidth of approximately six or seven percent. By including a broadbanding network between the diode 22 and the circulator 12, however, considerably wider bandwidth can be obtained. Such a broadbanding network is shown in FIG. 3. It functions as an impedance matching network between the parallel tuned diode 22 and the circulator 12. Assuming the tunnel diode 22 can be parallel resonated at the desired frequency, the broadband amplifier passband is determined by the length (approximately one-half wavelength) of the strip transmission line 19 between the capacitive gaps 60 and 62. The capacitor 60 immediately adjacent diode 22 is adjusted to give the desired amount of gain, and the capacitor 62 is adjusted to give the proper bandwidth and ripple desired. These capacitive gaps may actually overlap in which case the two center strips are separated electrically by .001 inch Teflon or Mylar. Further increases in bandwidth can be achieved by utilizing additional half wavelength sections. For purposes of illustration, the transmission line 19 is shown in FIG. 3 without the surrounding dielectric sections 24, which support the strips 20, 21 and 29. The dielectric has the function of supporting the center conductor and reducing the overall size by the square root of the dielectric constant.

In operation, the movable plunger 45 varies the reactance of the cavity to tune the tunnel diode 22 as shown schematically in FIG. 5. In addition to the capacitance of line 53, the amplifier structure has capacitance represented by capacitor 23 shown in dotted lines. This capacitance is comprised of the equivalent junction and case capacitance of the tunnel diode 22. Since the capacitance of line 53 is so much larger than capacitance 23, it is neglected. By parallel resonating capacitance 23 by use of the tuner, the reactance of the diode 22 is reduced so that it behaves as nearly pure alternating current negative resistance. Although the tuner is described for use with a tunnel diode, it need not be limited to that and could find utility to tune a diode in a mixer or a parametric amplifier, for instance, or even to tune a filter structure.

Figure 6:
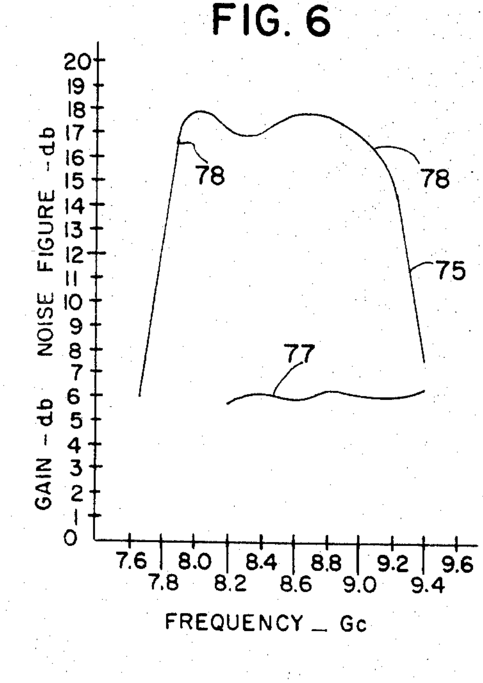
FIG. 6 is a graph illustrating the operating characteristics of the device of FIG. 1.

The operation of the amplifier of this invention will be further explained with reference to FIGS. 5 through 7 and the subsequent description. The microwave signal to be amplified enters the input port 14 of the circulator 12 and is circulated to the port 15 where it is coupled by the strip transmission line 19 to the tunnel diode 22. The line 19 may or may not include a broadbanding network comprised of the capacitors 62 and 60 or other types of distributed transmission line resonators. The diode 22 is biased by the DC source 65 and bias resistor 55 through the one-quarter wavelength transmission line 53 to behave as a negative alternating current resistance which is isolated from the bias circuit at the operating frequencies. The incident wave is reflected back to the circulator 12 by the diode 22, at a greater voltage level than the level of the incoming wave thereby increasing the gain of the signal. The amplifier module 10 has a characteristic impedance which is chosen in models without the broadbanding network to generate the desired voltage gain. The gain is defined by the magnitude of the voltage reflection coefficient which is equal to:

$$\frac{Y_0-Y}{Y_0+Y}$$

where $Y_0$ is the characteristic impedance of the amplifier module transmission line 20, and Y is the impedance of the tunnel diode 22. Because the tunnel diode is parallel resonated by the variable inductive tuner 68, the generated gain is a single function of the ratio of the impedance of the line $Y_0$ and the negative conductance of diode 22, providing the line 19 is impedance matched between the diode 22 and the circulator 12. If the impedance of the line 19 is different than the admittance of the circulator 12 an impedance transformer must be used in order to maintain a well matched transmission line.

When a broadbanding network as described above is used the gain is set by capacitance 60. FIG. 6 shows the measured gain 75 and noise FIGURE 77 for a broadbanded tunnel diode amplifier. This amplifier provides 16.5 db gain over greater than 1000 mc. at X-band measured at points 78 of the graph.

Figure 7:
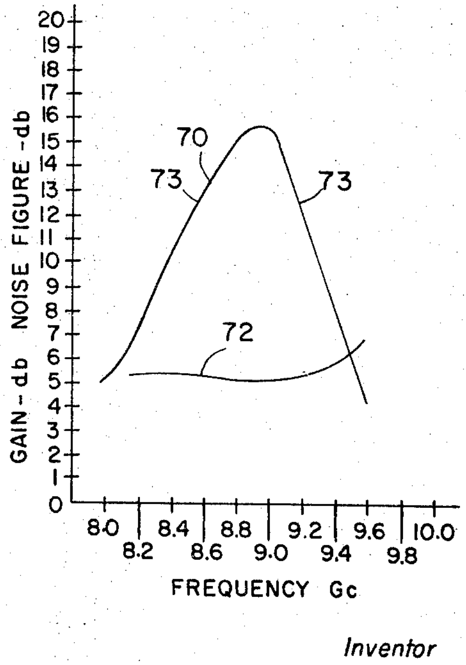
FIG. 7 is similar to FIG. 6 but illustrates the operating characteristics for a second embodiment of the invention.

FIG. 7 shows the measured gain 70 and noise figure 72 of a single tuned tunnel diode amplifier which does not have a broad banding network and which is constructed in accordance with his invention. The three db bandwidth taken at points 73 gives a minimum of 12.5 db gain for approximately 600 megacycles.

The operational characteristics are shown here as illustrative examples, and are not intended to limit the invention in any manner. Illustrative dimensions of the components used in the amplifier module 10 of the invention from which the above graphs were obtained are as follows:

| | | |
|---|---|---|
| Length of circulator **12** | inches | 2.0 |
| Width of circulator **12** | do | 1.2 |
| Length of module **10** | do | 1.6 |
| Width of module **10** | do | 1.3 |
| Maximum height of amplifier and circulator combined | do | 1 |
| Amplifier module **10** impedance | ohms | 50 |
| Strip transmission line of broadbanding network **20** impedance | do | 50 |
| Length of portion **21** of line **19** between capacitors **60** and **62** | inches | .285 |
| Length of portion **29** of line **19** | do | .073 |
| Characteristic impedance of portion **29** | ohms | 50 |
| Germanium tunnel diode **22** (cutoff frequency) | gc | 29 |
| Capacitor **60** | pf | .15 |
| Capacitor **62** | pf | .25 |
| Diode **22** bias voltage | mv | 160 |
| Prime DC power for operation | mw | 4 |

What has been described, therefore, is an integrated tunnel diode radio frequency amplifier that has a low noise figure and which exhibits a relatively high gain and wide bandwidth. The amplifier is relatively small and compact and is stable under various environmental conditions.

I claim:

1. An integrated tunnel diode microwave signal amplifier including in combination, a circulator having an input port, an output port and a third port, an amplifier module coupled to said third port and having first and second ground plane conductors, said amplifier module including an integrated strip transmission line having first and second portions and being sandwiched between said ground plane conductors, and a tunnel diode coupled to said transmission line, said first portion of said strip transmission line coupling the microwave signal from said circulator to said tunnel diode, a bias circuit coupled to said diode for biasing the same to exhibit negative alternating current resistance, said bias circuit including a conducting member in electrical contact with an electrode of said diode for applying thereto a bias voltage with respect to said ground plane conductors, a layer of dielectric material separating said conducting member from one of said ground plane conductors to form a low impedance transmission line therewith, a resistor in electrical contact with said conducting member, conducting securing means mechanically and electrically coupled to said one ground plane conductor and holding said resistor in engagement with said conducting member so that said resistor is electrically connected between said conducting member and said one ground plane conductor, and adjustable tuning means coupled by said second portion of said transmission line to said tunnel diode for resonating said diode, whereby the microwave signal coupled from said circulator to said tunnel diode is reflected therefrom at a greater level than the level of the incident signal to increase the gain thereof, said reflected signal being returned to said circulator by said first portion of said transmission line.

2. An integrated tunnel diode microwave signal amplifier including in combination, a circulator having a center conductor, an input port, an output port and a third port, an amplifier module coupled to said third port and having first and second ground plane conductors, said amplifier module including an integrated strip transmission line having a center conductor and first and second portions and being sandwiched between said ground plane conductors, a tunnel diode coupled to said transmission line, said first portion of said strip transmission line having said center conductor at one end connected to the center conductor of the circulator and the other end terminating at said tunnel diode for coupling the microwave signal from said circulator to said tunnel diode, a bias circuit coupled to said diode for biasing the same to exhibit negative alternating current resistance, and adjustable tuning means, said tuning means including a waveguide operated below the cutoff frequency thereof and being located between said ground plane conductors, said second portion of said transmission line having one end of said center conductor connected to said tunnel diode and the other end thereof connected to a wall of said waveguide to shunt said diode and to form a fixed short of said transmission line with said waveguide, a movable plunger slidably mounted in said waveguide for varying the length of said waveguide to vary the reactance of the same about a center frequency established by said fixed short thereby reducing the reactance of said tunnel diode at the operating frequencies thereof so that said tunnel diode impedance approaches a pure negative resistance, whereby the microwave signal coupled from said circulator to said tunnel diode is reflected therefrom at a greater level than the level of the incident signal to increase the gain thereof, said reflected signal being returned to said circulator by said first portion of said transmission line.

3. An integrated tunnel diode microwave signal amplifier, including in combination, a circulator having a center conductor, an input port, an output port and a third port, an amplifier module coupled to said third port and having first and second ground plane conductors, said amplifier module including an integrated strip transmission line having a center conductor and first and second portions and being sandwiched between said ground plane conductors, a tunnel diode coupled to said transmission line, said first portion of said transmission line coupling the microwave signal from said circulator to said tunnel diode and having a plurality of capacitive gaps in said center conductor thereof forming a broadbanding network for matching the impedance between said tunnel diode and said circulator, adjustable tuning means including a waveguide operated below the cutoff frequency thereof and being located between said ground plane conductors, said waveguide coupled in shunt across said tunnel diode by said second portion of said transmission line having one end of said center conductor connected to said tunnel diode and the other end thereof connected to a wall of said waveguide to form a fixed short of said transmission line therewith, and a movable plunger slidably mounted in said waveguide for varying the reactance of said tuning means about a center frequency established by said fixed short thereby reducing the reactance of said tunnel diode at the operating frequencies thereof so that said tunnel diode impedance approaches a pure negative resistance, whereby the microwave signal coupled from said circulator to said tunnel diode is reflected therefrom at a greater level than the level of the incident signal to increase the gain thereof, said reflected signal being returned to said circulator by said first portion of said transmission line.

4. An integrated tunnel diode microwave signal amplifier including in combination, a circulator having a center conductor, an input port, an output port, and a third port, an amplifier module coupled to said third port and having first and second ground plane conductors, said amplifier module including an integrated strip transmission line having a center conductor and first and second portions and being sandwiched between said ground plane conductors, a tunnel diode coupled to said transmission line, said first portion of said transmission line coupling the microwave signal from said circulator to said tunnel diode and including a broadbanding network for matching the impedance between said tunnel diode and said circulator, a bias circuit coupled to said diode for biasing the same to exhibit negative alternating current resistance, said bias circuit including a conducting member in electrical contact with an electrode of said diode for applying thereto a bias voltage with respect to said ground plane conductors, a layer of dielectric material separating said conducting member from one of said ground plane conductors to form a low impedance transmission line therewith, a resistor in electrical contact with said conducting member, conducting securing means mechanically and electrically coupled to said one ground plane conductor and holding said resistor in engagement with said conducting member so that said resistor is electrically connected between said conducting member and said one ground plane conductor, and adjustable tuning means including a waveguide operated below the cutoff frequency thereof and being located between said ground plane conductors, said waveguide coupled in shunt across said tunnel diode by said second portion of said strip transmission line having one end of said center conductor connected to said tunnel diode and the other end thereof connected to the bottom of said waveguide to form a fixed short of said transmission line therewith, and a movable plunger slidably mounted in said waveguide for varying the reactance of said tuning means about a center frequency established by said fixed short thereby reducing the reactance of said tunnel diode at the operating frequencies thereof so that said tunnel diode reactance approaches a pure alternating current negative resistance, whereby the microwave signal coupled from said circulator to said tunnel diode is reflected therefrom at a greater level than the level of the incident signal to increase the gain thereof, said reflected signal being returned to said circulator by said first portion of said transmission line.

5. An integrated tunnel diode microwave signal amplifier including in combination, a circulator having a center conductor, an input port, an output port and a third port, an amplifier module coupled to said third port and having first and second ground plane conductors, said amplifier module including an integrated strip transmission line having a center conductor and first and second portions and being sandwiched between said ground plane conductors and a tunnel diode coupled to said transmission line, said first portion of said strip transmission line coupled to the center conductor of the circulator for coupling the microwave signal from said circulator to said tunnel diode, a bias circuit coupled to said diode for biasing the same to exhibit negative alternating current resistance, said bias circuit including a conducting member in electrical contact with an electrode of said diode for applying thereto a bias voltage with respect to said ground plane conductors, a layer of dielectric material separating said conducting member from one of said ground plane conductors to form a low impedance transmission line therewith, a resistor in electrical contact with said conducting member, conducting securing means mechanically and electrically coupled to said one ground plane conductor and holding said resistor in engagement with said conducting member so that said resistor is electrically connected between said conducting member and said one ground plane conductor, and adjustable tuning means, said tuning means including a waveguide below the cutoff frequency thereof and being located between said ground plane conductors, said waveguide coupled in shunt across said tunnel diode by said second portion of said transmission line having one end of said center conductor connected to said tunnel diode and the other end thereof connected to a wall of said waveguide to form a fixed short of said transmission line therewith, and a movable plunger slidably mounted in said waveguide for varying the reactance of said waveguide about a center frequency established by said fixed short thereby reducing the reactance of said tunnel diode at the operating frequencies thereof so that said tunnel diode impedance approaches a pure negative alternating current resistance, whereby the microwave signal coupled from said circulator to said tunnel diode is reflected therefrom at a greater level than the level of the incident signal to increase the gain thereof, said reflected signal being returned to said circulator by said first portion of said transmission line.

6. An amplifier module for use with an integrated microwave signal amplifier, said module including in combination, first and second ground plane conductors, an integrated strip transmission line having a center conductor and first and second portions and being sandwiched between said ground plane conductors, a tunnel diode connected to said transmission line, means applying an input signal to said first portion of said transmission line whereby said input signal is applied by said transmisson line to said tunnel diode, said first portion of said transmission line including a broadbanding network for matching the impedance between said tunnel diode and said input signal means, a bias circuit coupled to said diode for biasing the same to exhibit negative alternating current resistance, said bias circuit including a conducting member in electrical contact with an electrode of said diode for applying thereto a bias voltage with respect to said ground plane conductors, a layer of dielectric material separating said conducting member from one of said ground plane conductors to form a low impedance transmission line therewith, a resistor in electrical contact with said conducting member, conducting securing means mechanically and electrically coupled to said one ground plane conductor and holding said resistor in engagement with said conducting member so that said resistor is electrically connected between said conducting member and said one ground plane conductor, and adjustable tuning means including a waveguide operated below the cutoff frequency thereof and being located between said ground plane conductors, said waveguide coupled in shunt across said tunnel diode by said second portion of said strip transmission line and having one end of said center conductor connected to said tunnel diode and the other end thereof connected to the bottom of said waveguide to form a fixed short of said transmission therewith, and a movable plunger slidably mounted in said waveguide for varying the reactance of said waveguide about a center frequency established by said fixed short thereby reducing the reactance of said tunnel diode at the operating frequency thereof so that said tunnel diode reactance approaches a pure negative resistance, whereby the microwave input signal coupled to said tunnel diode is reflected therefrom at a greater level than the level of the incident signal to increase the gain thereof, said reflected signal being returned by said first portion of said transmission line.

7. An amplifier module for use with an integrated microwave signal amplifier, said module including in combination, first and second ground plane conductors, an integrated strip transmission line having a center conductor and first and second portions and being sandwiched between said ground plane conductors, a tunnel diode connected to said transmission line, means applying an input signal to said first portion of said strip transmission line whereby said input signal is applied to said transmission line to said tunnel diode, a bias circuit coupled to said diode for biasing the same to exhibit negative alternating current resistance, said bias circuit including a conducting member in electrical contact with an electrode of said diode for applying thereto a bias voltage with respect to said ground plane conductors, a layer of dielectric material separating said conducting member from one of said ground plane conductors to form a low impedance transmission line therewith, a resistor in electrical contact with said conducting member, conducting securing means mechanically and electrically coupled to said one ground plane conductor and holding said resistor in engagement with said conducting member so that said resistor is electrically connected between said conducting member and said one ground plane conductor, said tuning means including a waveguide operated below the cutoff frequency thereof and being located between said ground plane conductors, said waveguide coupled in shunt across said tunnel diode by said second portion of said transmission line having one end of said center conductor connected to said tunnel diode and the other end thereof connected to a wall of said waveguide to form a fixed short of said transmission line therewith, and a movable plunger slidably mounted in said waveguide for varying the reactance of said waveguide about a center frequency established by said fixed short thereby reducing the reactance of said tunnel diode at the operating frequencies thereof so that said tunnel diode reactance approaches a pure negative alternating current resistance, whereby the input microwave signal coupled to the tunnel diode is reflected therefrom at a greater level than the level of the incident signal to increase the gain thereof, said reflected signal being returned by said first portion of said transmission line.

References Cited

UNITED STATES PATENTS

| | | | |
|---|---|---|---|
| 3,212,018 | 10/1965 | Amoss et al. | 330—56 X |
| 3,244,999 | 4/1966 | Hoover | 330—61 |
| 3,337,812 | 8/1967 | Webb | 330—56 X |

ALFRED L. BRODY, *Primary Examiner.*

NATHAN KAUFMAN, *Assistant Examiner.*